United States Patent [19]
Hieda et al.

[11] Patent Number: 6,159,868
[45] Date of Patent: Dec. 12, 2000

[54] METHOD OF FORMING A HIGH QUALITY LAYER OF BST

[75] Inventors: Katsuhiko Hieda, Yokohama; Masahiro Kiyotoshi, Sagamihara; Kazuhiro Eguchi, Chigasaki, all of Japan

[73] Assignee: Kabushiki Kaisha Toshiba, Kawasaki, Japan

[21] Appl. No.: 09/239,796

[22] Filed: Jan. 29, 1999

[30] Foreign Application Priority Data

Jan. 30, 1998 [JP] Japan .................................. 10-019671

[51] Int. Cl.[7] .................................................. H01L 21/64
[52] U.S. Cl. ............................................................. 438/778
[58] Field of Search ....................... 438/778, 3, DIG. 907, 438/DIG. 909, DIG. 913

[56] References Cited

U.S. PATENT DOCUMENTS 5,728,603 3/1998 Emesh et al. .
5,853,500 12/1998 Joshi et al. .

FOREIGN PATENT DOCUMENTS

| 7-58292 | 3/1995 | Japan . |
| 7-268634 | 10/1995 | Japan . |
| 8-139043 | 5/1996 | Japan . |
| 9-219497 | 8/1997 | Japan . |

*Primary Examiner*—Charles Bowers
*Assistant Examiner*—Evan Pert
*Attorney, Agent, or Firm*—Finnegan, Henderson, Farabow, Garrett & Dunner, L.L.P.

[57] ABSTRACT

A method of manufacturing a semiconductor device characterized by a method of forming a thin insulating film mainly composed of barium strontium titanate, the method having a first step for forming, on a semiconductor substrate, a thin BST film by a CVD method, and a second step for performing annealing at a temperature higher than a temperature at the thin BST films is formed so that crystallinity of the thin BST films is improved, wherein the temperature of the semiconductor substrate is maintained at a temperature higher than 250° C. in a period of time between the first step and the second step in order to prevent a deterioration in a quality of the thin BST film.

30 Claims, 7 Drawing Sheets

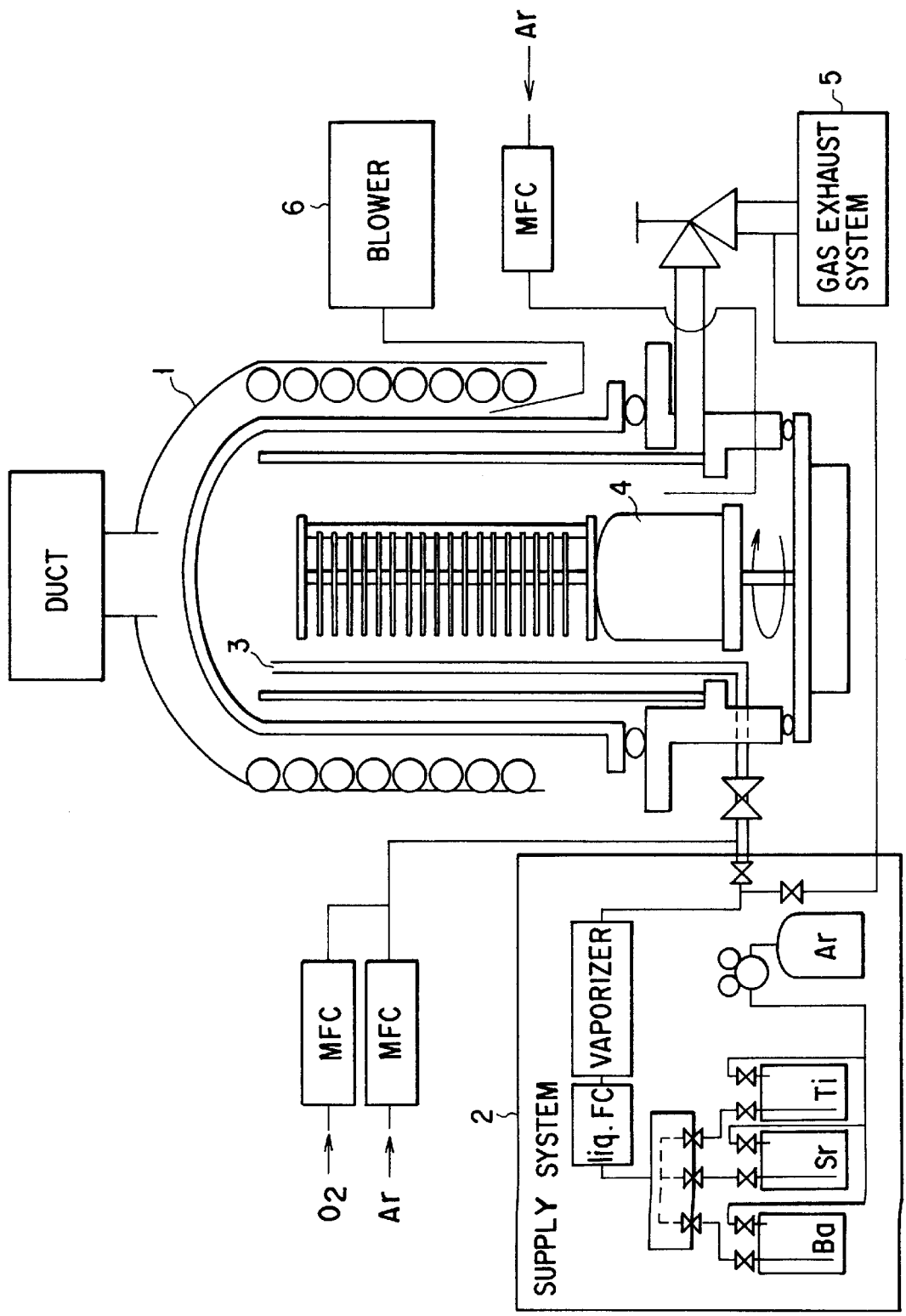
F I G. 1

CONVENTIONAL APPARATUS

METHOD OF FORMING A HIGH QUALITY LAYER OF BST

BACKGROUND OF THE INVENTION

The present invention relates to a method of manufacturing a semiconductor device, and more particularly to a method of manufacturing a semiconductor device characterized by a process for forming a thin insulating film mainly composed of barium strontium titanate.

Since electronic devices have been manufactured precisely and integrated considerably highly, the function of the electronic device cannot easily be realized by simply devising the circuit structure. The electronic devices include, for example, semiconductor memories, such as an SRAM (Static Random Access read write Memory) having a circuit structure formed by combining a plurality of transistors to perform an operation for storing information. The semiconductor memories include an EEPROM (Electrically Erasable and Programmable Read Only Memory) and a DRAM (Dynamic Random Access Memory) which has a circuit structure constituted by combining transistors and capacitors to perform an operation for storing information. The foregoing semiconductor memories cannot easily be realized by combining conventional MOS transistors and MOS capacitors because the area of the memory cell constituted by the above-mentioned devices has been reduced.

In particular, a semiconductor memory of a type comprising MOS capacitors must prevent reduction in the S/N ratio of a read signal even if the minimum design rule of the device is reduced. However, a predetermined capacity of the capacitor cannot easily be maintained.

In addition to realizing the function of the electronic device by simply devising the circuit structure, use of a thin film made of a functional material, that is, use of the characteristics of the material becomes advantageous.

As a thin insulating film for a MOS capacitor, employment of a thin insulating film has been considered which is made of a functional material, for example, $Ba_xSr_{1-x}TiO_3$ (BST) or $PbZr_xTi_{1-x}O_3$ (PZT) (where $0<x<1$) having a dielectric constant higher than that of a silicon oxide film and that of a silicon nitride film/silicon oxide laminate film (an NO film). Moreover, a device, such as an FRAM (Ferroelectric Random Access read write Memory), which operates on a novel principle, has been suggested.

BST is a promising material for making a DRAM capacitor dielectric film which encounters a difficulty in maintaining a sufficiently large capacitor area. The difficulty is created if the degree of integration is raised in order to realize a dielectric constant, the value of which is not smaller than hundreds at ambient temperatures.

When a capacitor device of a semiconductor integrated circuit having a high degree of integration is manufactured by using a ferroelectric film, a chemical-vapor deposition method is a suitable method as a technique for forming the ferroelectric film.

That is, employment of the CVD (chemical vapor deposition) method enables precise control of the composition and reproducibility of the process, that is, an excellent step coverage to be obtained. Therefore, the reliability and the like of the electronic device can significantly be improved.

To form a thin BST film, which is a multi-element thin metal-oxide film, the forming process is usually performed under a mass-transfer rate limited condition. Since the CVD method under the mass-transfer rate limited condition encounters deterioration in the step coverage, employment of a CVD method under a kinetically limited condition for forming the thin BST film has been suggested (Jpn. Pat. Appln. KOKAI Publication No. 7-50104).

The CVD film forming process under the kinetically limited condition which enables a satisfactory step coverage is performed at a deposition temperature of 500° C. or lower. Since the melting point of the BST is 1000° C. or higher, a thin BST film having satisfactory crystallinity cannot easily be formed. Therefore, the thin BST film formed by the CVD method has usually been annealed at the crystallizing temperature or higher (Japanese Patent Laid-Open No. 7-58292 and Japanese Patent Laid-Open No. 9-219497).

However, the method, which has the steps of forming a film by the CVD method under the kinetically limited condition and crystallizing the thin BST film, encounters a problem in that the dielectric constant of the thin BST film is reduced excessively as compared with that of a thin BST film formed at the crystallizing temperature (for example, 700° C. or higher) or higher. The reason for this lies in that the conventional deposition process comprising the steps of forming a film by the CVD method and annealing for crystallizing the film has the following problem.

That is, a deposition process of the foregoing type usually suffers from a problem which arises in a process for annealing the thin BST film formed by a CVD apparatus in an independent annealing apparatus. The problem arises in that the dielectric constant of the thin BST film is reduced considerably because the surface of the thin BST film, which is sensitive to influences of an environment, is exposed to outside air when the thin BST film is transferred from the CVD apparatus to the annealing apparatus.

To overcome the above-mentioned problem, a cluster tool, as shown in FIG. 7, comprising a CVD chamber 81 and a annealing chamber (annealing chamber) 82, has usually been employed. Thus, the thin BST film is transferred between the two chambers in a vacuum state or the same is conveyed in a controlled atmosphere. As an alternative to employment of the cluster tool, a method may, of course, be employed in which the thin BST film is transferred between independent apparatuses by a wafer carrier having a controlled atmosphere.

However, all of the above-mentioned conventional methods have a problem which arises in a process for transferring a BST deposited wafer from the CVD chamber (the apparatus) to the annealing chamber (the apparatus). There arises the problem in that the temperature of the substrate (the temperature of the wafer) is temporarily lowered to the deposition temperature or lower.

That is, as shown in FIG. 8, the semiconductor substrate is caused to have a standard heat history when the moving method is employed which uses the cluster tool structured as shown in FIG. 7 and comprising the CVD chamber 81 and the annealing chamber 82. The standard history inevitably encounters lowering of the temperature of the substrate to a level lower than the deposition temperature by the CVD method when the transfer between the chambers is performed.

Therefore, the crystalline structure of the thin BST film formed at a temperature not higher than 500° C., which is under a kinetically limited condition for forming the BST film by the CVD method, is an amorphous state. Even if BST has been crystallized, the crystalline structure is in a metastable state. That is, if the temperature of the structure is lowered below a critical level lower than the deposition temperature, the thin BST film undesirably forms a stable phase at the low temperature. The stable phase inhibits complete crystallization. Therefore, even if the annealing at a high temperature is performed, there arises a problem in that sufficient crystallinity cannot be obtained. If annealing of BST is sequentially performed without lowering the temperature to a level lower than the deposition temperature, excellent crystallinity can be obtained.

If the temperature of the substrate is lowered during transfer between the chambers, there arises a problem in that the adhesion between the thin BST film and a lower ground (for example, a Ru film) deteriorates. Thus, the thin BST film separates undesirably.

As described above, the suggestion has been made that the conventional method of forming a thin BST film is performed such that the thin BST film is formed by the CVD method under a kinetically limited condition in a state in which the wafer is not exposed to outside air after which annealing is performed to crystallize the thin BST film. The above-mentioned method comprising the step of moving the wafer having a CVD film formed by the above-mentioned method from the CVD chamber to the annealing chamber. Therefore, the foregoing method, however, suffers from problems in that satisfactory crystallinity cannot be obtained and that the formed film is peeled because the temperature of the substrate is lowered during the transfer.

BRIEF SUMMARY OF THE INVENTION

Accordingly, an object of the present invention is to provide a method of manufacturing a semiconductor device having the steps of forming a thin insulating film (a thin BST film) mainly composed of BST and performing annealing to crystallize the thin BST film so as to form a thin BST film having an excellent quality.

The manufacturing method according to the present invention is characterized by a contrivance employed when a thin BST film is formed by a CVD method after which annealing is performed at a temperature higher than the deposition temperature for the thin BST film. The contrivance is arranged such that lowering of the temperature of a substrate to a predetermined temperature (for example, a temperature not higher than the deposition temperature, a temperature not higher than the film peeling temperature or a temperature not higher than a temperature at which a different phase is introduced into a BST crystalline phase) or lower is prevented.

That is, to achieve the above-mentioned object, a method of manufacturing a semiconductor device according to a first aspect of the present invention comprises a first step for forming a thin BST film on a semiconductor substrate by a CVD method; and a second step for performing annealing at a temperature higher than the deposition temperature for the thin BST film so as to improve the crystallinity of the thin BST film, wherein lowering of the temperature of the semiconductor substrate occurring in a step between the first step and the second step to be a temperature not higher than a predetermined temperature is prevented.

A method of manufacturing a semiconductor device according to the present invention comprises a first step for forming a thin BST film mainly composed of barium strontium titanate on a semiconductor substrate by a CVD method; and a second step for improving the crystallinity of the thin BST film by performing annealing at a temperature higher than the deposition temperature for the thin BST film, wherein a sequential process comprising the first step and the second step is repeated several times so that a thin BST film mainly composed of barium strontium titanate and having a required thickness is formed, and the sequential process is performed in such a manner that as to prevent lowering of the temperature of the semiconductor substrate to be a level not higher than a predetermined is prevented in a step between the first step and the second step.

Preferred aspects of the present invention are as follows.

(1) The temperature not higher than the predetermined temperature may be a temperature at which a stable phase or a different phase is formed in the thin BST film. Specifically, the temperature may be 250° C. or lower. The different phase may be a phase except for a perovskite crystalline phase mainly composed of barium strontium titanate.

(2) The temperature not higher than the predetermined temperature may be a temperature at which the thin BST film is peeled. Specifically, the temperature may be 200° C. or lower. The temperature not higher than the predetermined temperature may be a temperature at which the thin BST film or an electrode film is peeled if the electrode film is formed below the BST film.

(3) The predetermined temperature may be a temperature at which the thin BST film is formed in the first step.

(4) The annealing temperature may be a temperature not lower than a temperature at which the thin BST film is crystallized.

(5) The first and second steps may be sequentially performed on the same wafer susceptor in the same annealing chamber.

(6) The second step may be structured such that time taken from raising of the temperature of the semiconductor substrate to the deposition temperature for the thin BST film to lowering of the temperature of the semiconductor substrate subjected to the annealing to the deposition temperature is set to be 30 minutes or longer.

(7) At least either of the deposition temperature or a gas flow rate in the first step may be made to be varied in the sequential steps.

(8) In the two sequential steps which are performed sequentially, the deposition temperature for the thin BST film in the first step included in the sequential steps may be made to be lower than a deposition temperature for the thin BST film in the first step in a later step of the sequential steps.

(9) At least either of the gas flow rate or timing at which the gas is supplied in the first step may be varied in the two sequential steps which are performed sequentially.

(10) The environmental pressure around the semiconductor substrate is exhausted in a step between the first and second steps in the sequential steps so that a vacuum state is realized.

(11) A step which is performed between the first and second steps in the sequential steps and in which the environmental pressure around the semiconductor substrate is exhausted so that a vacuum state is realized and a step for supplying gas again to raise the pressure are repeated plural times.

A method of manufacturing a semiconductor device according to a third aspect of the present invention comprises a first step for forming a thin BST film mainly composed of barium strontium titanate on a semiconductor substrate by a CVD method; and a second step for improving the crystallinity of the thin BST film by performing annealing, wherein the partial pressure of oxygen in the atmosphere in which the semiconductor substrate exists in the step between the first step and the second step.

FIG. 10 shows results of experiments performed by the inventors of the present invention. The temperature of a thin BST film formed at a deposition temperature of 400° C. by the CVD method was temporarily lowered to a temperature $T_D$ of the substrate shown in the graph, after which the temperature was raised. Thus, annealing was performed at 800° C. which was sufficiently higher than the crystallizing temperature for the BST. FIG. 9 shows dependency of the dielectric constant of the thin BST film and that of the full width at half maximum (FWHM) at [110] peak of the BST measured by X-ray analysis on the temperature realized after the temperature was lowered.

The experiments were performed by using an apparatus which was capable of performing a deposition process and an annealing process in one chamber and which will be described later in the embodiment of the present invention. A heat history of the thin BST film is shown in FIG. 10. The thickness of the thin BST film was 30 nm. Samples (capacitors) for measuring the dielectric constants of both of the upper and lower electrodes were ruthenium films each having a thickness of 50 nm. The dielectric loss of each sample for measuring the dielectric constant was measured by a HP4192A measuring apparatus at a measuring frequency of 100 kHz. The dielectric loss of each sample was 0.1% or lower.

As can be understood from FIG. 9, if the temperature of the substrate is lowered to 250° C. which is lower than the deposition temperature, a poorly low dielectric constant can be obtained in spite of performing annealing. As can be understood from FIG. 9, samples, the temperatures of which were not lowered, and which were in-situ annealed at high-temperature, enabled a highest dielectric constant and a narrowest full width at half maximum (which indicated excellent crystallinity). That is, a fact can be recognized that a high dielectric constant and a narrow full width at half maximum can be realized when the temperature of the substrate is not lowered to a temperature not higher than the deposition temperature after the film has been formed by the CVD method. Then, the high-temperature annealing process is in-situ executed.

The present invention has been suggested on the basis of the above-mentioned results of the experiments. The concept of the present invention is that deterioration in the quality of a thin BST film is prevented when the thin BST film formed by a CVD method is annealed at a temperature higher than the deposition temperature. To achieve this, lowering of the temperature of the thin BST film to a temperature not higher than a predetermined temperature is prevented in a period of time between the step for forming the thin BST film and the annealing step. Thus, a thin BST film having an excellent quality can be obtained.

When the thus-obtained thin BST film is employed as a capacitor device of a semiconductor integrated circuit, a storage device composed of capacitors each having satisfactory charge storing performance and exhibiting a high degree of integration can be manufactured with an excellent reproducibility.

The specific operations and effects of the present invention will now be described.

In a process for crystallizing a thin amorphous BST film by annealing, carbon incorporated in the thin BST film is desorbed, hydrogen is desorbed and a different phase ($Ba_xSr_{4-x}Ti_3O_{10-y}$ or the like) mixed in the thin BST film at a low temperature is decomposed. Therefore, the volume of the thin BST film is reduced. If the thickness of the thin BST film is tens of nm or greater, there is a possibility that microcracks causing a leakage current increase are formed in the thin BST film.

When a thin BST film having a required thickness is formed by repeating a step for forming the thin BST film by the CVD method and crystallizing the thin BST film by performing annealing, annealing is performed whenever a thin BST film having a thickness of 5 nm or smaller is formed which does not raise a problem of change in the volume by the method according to the present invention. As a result, microcracks can satisfactorily be prevented so that a thin BST film having a required thickness and capable of preventing a leakage current increase is easily formed.

When annealing is performed whenever a thin BST film having a thickness of 10 nm or smaller with which impurities can easily be desorbed, microcracks can be prevented. Moreover, desorption of impurities, such as carbon, in the thin BST film, which occurs during the crystallizing process caused by the annealing, can be enhanced. Therefore, a thin BST film exhibiting a high dielectric constant can easily be formed such that increase of leakage currents is prevented.

When the surface of the thin amorphous BST film is exposed to carbon dioxide after the thin BST film has been formed by the CVD method, carbon dioxide and BST react with each other. Thus, $BaCO_3$ and $SrCO_3$ are undesirably formed which cause the dielectric constant to be reduced and leakage currents to be enlarged.

Exposure to carbon dioxide takes place when the temperature of the substrate is made to be lower than the deposition temperature in the CVD chamber for forming the film as well as when the surface of the thin BST film is exposed to the atmosphere.

The reason for this lies in that $CO_2$ gas formed by combustion of DPM ($=Cl_{11}H_{19}O_2$) which is a ligand of metal complexes, THF ($=C_4H_8O$) which is a solvent of the raw material and the like remains in the CVD reactor. The $CO_2$ gas concentration is in a equilibrium state with respect to the concentration of $CO_3$ contained in the thin BST film at temperature not lower than the deposition temperature. Therefore, further introduction into the thin BST film can be prevented. If the temperature of the semiconductor substrate having the thin BST film formed thereon is lowered, $CO_2$ is undesirably absorbed in the thin BST film.

However, the preferred aspect (3) of the present invention is structured to prevent lowering of the temperature of the substrate to a temperature lower than the deposition temperature until BST is crystallized. Therefore, a thin BST film, which does not contain a large amount of carbon and which exhibits an excellent quality, can be formed.

When the preferred aspects of the present invention are combined ((3)+(4)) with each other, deterioration in the quality of the thin BST film can effectively be prevented. The deterioration is caused from lowering of the temperature of the substrate to a temperature not higher than the deposition temperature in a process for moving the semiconductor substrate having the BST film formed by the CVD chamber (the apparatus) to the annealing chamber (the apparatus).

That is, the crystal structure of the thin BST film formed at a temperature not higher than 500° C., which is under a kinetically limited condition, is in a metastable state. If the temperature of the substrate is lowered to 250° C. which is lower than the deposition temperature, the thin BST film undesirably forms a stable phase ($Ba_xSr_{4-x}Ti_3O_{10-y}$: 0<x<4, 0<y<10) at low temperatures. The structure of the stable phase inhibits complete crystallization. Therefore, even if annealing is performed at a high temperature after formation of the stable phase, there arises a problem in that satisfactory crystallization cannot be realized. The method according to the present invention (preferred aspect (3)+preferred aspect (4)) has the structure that annealing is sequentially performed at a temperature not lower than the crystallizing temperature for BST such that the temperature of the substrate is made to be higher than the CVD deposition temperature for the thin BST film. As a result, excellent crystallinity can be realized. Thus, a thin BST film exhibiting a high dielectric constant can easily be formed.

If the crystallization of the thin BST film is not performed after the thin BST film has been formed by the CVD method and the temperature of the substrate is made to be lower than the deposition temperature, the concentration of oxygen which can stably exist in the thin BST film is raised as the temperature of the thin BST film is raised. Therefore, oxygen in the vicinity of the surface of the thin BST film, the temperature of which can easily be raised, is diffused to the outside. As a result, the concentration of oxygen in the vicinity of the surface of the thin BST film is considerably lowered. That is, oxygen deficiency takes place in the vicinity of the surface of the thin BST film.

The foregoing oxygen deficiency acts as a donor. Therefore, if the thin BST film having the oxygen deficiency is employed as the capacitor insulating film, there arises a problem in that the leakage current of the capacitor increases.

The method according to the present invention (preferred aspect (3)+preferred aspect (4)) has the structure that the annealing is sequentially performed at a temperature not lower than the crystallizing temperature for the BST such that the temperature is made to be higher than the deposition temperature. As a result, a thin BST film having sufficiently small oxygen deficiency can be formed. If the foregoing thin BST film is employed as the capacitor insulating film, a capacitor which is capable of satisfactorily preventing the leakage current can easily be manufactured.

The preferred aspect (5) of the present invention has the structure that the first step (the deposition step) and the second step (the annealing process for crystallization) are sequentially performed. Therefore, the number of processes can be reduced. Moreover, annealing step is easily permitted on condition that the temperature of the substrate is kept higher than the CVD temperature. In addition, particles caused by wafer transfer or thermal stress can be prevented.

The preferred aspect (6) of the present invention has the structure that time (raw process time of annealing for the thin BST film) taken from raising of the temperature of the semiconductor substrate to the deposition temperature for the thin BST film to lowering of the temperature of the annealed semiconductor substrate to the deposition temperature is set to be 30 minutes or longer. Thus, a thin BST film having an excellent electric characteristic can easily be formed.

The present invention of the third aspect has the structure that the partial pressure of oxygen of the atmosphere in which the semiconductor substrate exists in a step between the first step (the deposition step) and the second step (the crystallizing step) is made to be a predetermined partial pressure or higher. For example, the partial pressure of oxygen is made to be not lower than that of oxygen when the deposition step is performed. Thus, desorption of oxygen from the thin BST film causing deterioration in the crystallinity which reduces the dielectric constant or oxygen deficiency which increases the leakage current can be prevented.

When the deposition conditions are changed to the preferred aspects (7) to (9), the following effects can be obtained.

For example, when the thin BST film is employed as a capacitor insulating film, the leakage current of the thin BST film mainly depends on a Schottky barrier of the interface and the density of the defect. When only the interface layer is formed by a film having a somewhat small dielectric constant and having small oxygen deficiency or formed by a film having a somewhat small dielectric constant and capable of forming a high Schottky barrier between the film and the electrode, the leakage current increase of the thin BST film capacitor can be prevented.

The leakage current of the thin BST film considerably depends on the surface roughness of the thin BST film. Therefore, the thin BST film in the interface portion which is in contact with the surface of the electrode is formed under a condition that a uniform initial nuclear is formed in spite of a low deposition rate. Thus, a thin BST film having a flat and smooth surface can be obtained. As a result, the leakage current can be reduced.

As in the preferred aspects (10) and (11) according to the present invention, the environmental pressure around the semiconductor substrate is exhausted so that a vacuum state is realized in the step between the first and second steps. Thus carbon dioxide is desorbed from the BST film into the vacuum exhaust gas. Therefore, the concentration of impurities in the formed BST film can considerably be lowered.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a schematic view showing a semiconductor manufacturing apparatus which is capable of sequentially performing a CVD deposition step and a annealing step according to a first embodiment of the present invention;

DETAILED DESCRIPTION OF THE INVENTION

Figure 2:
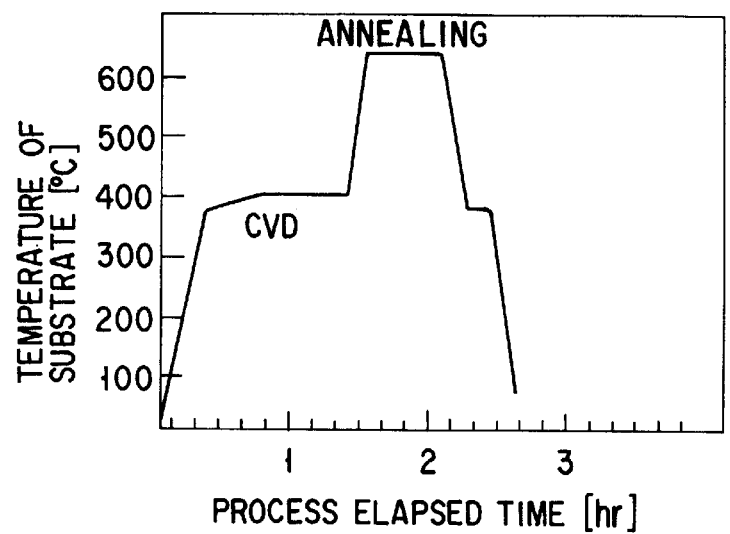
FIG. 2 is a graph showing the relationship between lapses of time in the process of the method of forming a thin BST film according to the first embodiment and temperatures of the semiconductor substrate.

Embodiments of the present invention will now be described with reference to the drawings.

First Embodiment

FIG. 1 is a schematic view showing an apparatus for manufacturing a semiconductor device which is capable of sequentially performing a step for forming a film by a CVD method and an annealing step according to a first embodiment of the present invention.

The apparatus for manufacturing a semiconductor comprises a reaction chamber 1 (a batch type processing furnace having a hot wall); a source-gas supply system 2 which vaporizes a liquid source to generate reaction gas; a multi-hole injector 3 and a gas injector 4 for introducing the reaction gas into the furnace of the reaction chamber 1; a gas exhaust system 5 for exhausting the gas in the furnace; and a mechanism (blower) 6 arranged to rapidly cool the reactor and permitting high speed raising/lowering of the temperature of the reactor at 100° C./minute or higher.

A method of forming a thin BST film by using the above-mentioned apparatus for manufacturing a semiconductor will now be described.

Initially, a semiconductor substrate having a surface on which the thin BST film will be formed is prepared. The semiconductor substrate having the surface on which a ruthenium film (a lower capacitor electrode) having a thickness of 50 nm is formed by a sputtering method is placed on a quartz wafer boat (a wafer susceptor). Then, the quartz wafer boat is introduced into a reactor purged with N2 and heated to 380° C.

After the quartz wafer boat has been introduced, gas in the furnace is exhausted by the gas exhaust system 5, and then vacuum leak is checked. Then, oxygen in a quantity of 3 slm and argon in a quantity of 1.5 slm are introduced through the multi-hole injector 3. Moreover, argon in a quantity of 500 sccm is introduced through the gas injector 4. Thus, the pressure in a reactor or reaction chamber 1 is set to be 200 Pa. In a state in which the pressure of 200 Pa in the reaction chamber 1 is maintained, heat recovery time is about 30 minutes. Thus, the temperature in the reaction chamber is uniformly made to be 400° C.

Then, a source gas for BST is introduced into the reaction chamber 1 from the source-gas supply system 2. In this embodiment, the liquid source for BST in the source supply system 2 is tetrahydrofuran (THF: $C_4H_8O$) solution which contains sources which are $Ba(dpm)_2$, $Sr(dpm)_2$ and $Ti(dpm)_2$ $(t-OC_4H_9)_2$ at a concentration of 0.5 mol/l. Ba, Sr and Ti source supply rates are independently controlled. The sources $Ba(dpm)_2$, $Sr(dpm)_2$ and $Ti(dpm)_2$ $(t-OC_4H_9)_2$ are supplied at rates of 0.3 sccm, 0.2 sccm and 0.6 sccm, respectively.

The liquid sources are vaporized and mixed with one another so as to be supplied to the spaces among the semiconductor substrates through the multi-hole injector 3 having blowing openings corresponding to the semiconductor substrates (wafers). The supply rate of each source is controlled by a liquid flow controller (liq. FC) of the source-gas supply system 2. The sources are vaporized by a vaporizer of the source-gas supply system 2.

Under the above-mentioned deposition conditions, a realized rate for forming the thin BST film was 0.8 nm/minute.

In a state in which the temperature in the reactor was maintained at 400° C., argon in a quantity of 3 slm is introduced into the reactor through the multi-hole injector 3. Moreover, argon in a quantity of 500 sccm is introduced into the reactor through the gas injector 4 so that replacement of the atmosphere in the reaction tube is performed. The replacement of the atmosphere is performed to prevent undesirable oxidation of the lower electrode made of ruthenium if the temperature is raised to a crystallizing temperature for the BST in an atmosphere containing oxygen.

Then, annealing was performed such that the temperature of the substrate was raised to 650° C. at a rate of 100° C./minute and the raised temperature was maintained for 30 minutes. Thus, the thin BST film was crystallized.

Then, the temperature of the substrate was lowered to 380° C. at a rate of 50° C./minute in the same atmosphere. Moreover, the pressure in the reaction tube is restored to the atmospheric pressure. Then, the semiconductor substrate having the thin BST film formed thereon was taken out of the reaction chamber 1.

The relationship between elapsed time of the process and the temperatures of the substrate realized in the above-mentioned sequential process is shown in FIG. 2. The dielectric constant of the thin BST film finally obtained in this embodiment was measured. Moreover, the full width at half maximum at [110] peak of BST of the foregoing thin BST film was measured by X-ray analysis. Similarly, the dielectric constant of a thin BST film was measured which was formed by the CVD method by using the above-mentioned apparatus and which was obtained by temporarily extracting the substrate on which thin BST film formed into the atmosphere so as to be cooled and exposed to the atmosphere, after which the thin BST film was annealed for crystallization. Moreover, the full width at half maximum at [110] peak of the BST of the foregoing thin BST film was measured by X-ray analysis. Results of the measurements were shown in Table 1.

TABLE 1

|  | Relative dielectric constant ($\epsilon_0$) | Full width at half maximum (degree) |
| --- | --- | --- |
| Embodiment | 400 | 4 |
| Temporarily cooled in air | 260 | 17.4 |

The thickness of each sample thin BST film was 30 nm. Ruthenium films each having a thickness of 50 nm were employed to form the upper capacitor electrode and the lower capacitor electrode of each sample. An HP4192A measuring apparatus was operated to perform measurements at a measuring frequency of 100 kHz. As a result, the dielectric loss of each sample was 0.1% or lower. Also sufficiently small leakage currents of $10^{-8}$ A/cm or smaller were measured when voltages of ±2V were applied.

As can be understood from Table 1, the sample restored to the room temperature realized a poorly low dielectric constant. Another fact can be recognized that the highest dielectric constant and a narrowest full width at half maximum (indicating excellent crystallinity) were realized by the sample having the film formed by the CVD method and subjected to the process that lowering of the temperature was prevented and high-temperature annealing was sequentially performed.

That is, to obtain excellent thin BST film, it is preferable that the process is shifted to the high-temperature annealing process such that the temperature of the sample having the film formed by the CVD method is not lowered to the room temperature.

Research and development performed by the inventors of the present invention resulted in recognition of a necessity of preventing lowering of the temperature of the substrate to 250° C. or lower during a period of time from formation of the film by the CVD method to the high-temperature annealing step.

Another fact was found that peeling of the thin BST film must be prevented by maintaining the temperature of the substrate to be higher than 200° C. in a period of time from forming of the film by the CVD method to high-temperature annealing.

When the step for forming the film by the CVD method and the annealing step are sequentially performed in the same furnace as employed in this embodiment, the number of steps can be reduced. After the thin BST film has been formed, annealing for crystallization is sequentially performed. Thus, stress of the film can be reduced. As a result, peeling of the film and dust caused from the peeling of the film occurring during wafer transfer can be prevented.

In this embodiment, the film deposition step and the annealing step are successively performed, that is, the annealing step is performed after the film deposition step has been completed. Thus, the raw process time (in particular, heat treatment time which is at a high temperature) can be shortened. Therefore, an adverse influence on an electrode made of a material, such as Pt or Ru, which is a noble material for forming an electrode, and which easily encounters peeling of a formed film as a result of the heat treatment for long time can be prevented.

Second Embodiment

In this embodiment, an apparatus for manufacturing a semiconductor similar to that according to the first embodiment was operated so that a thin BST film was formed by the CVD method.

Initially, a semiconductor substrate having a surface on which the thin BST film will be formed is prepared. The semiconductor substrate having the surface on which a platinum lower electrode (having a thickness of 50 nm) and a titanium film (having a thickness of 2 nm) serving as an adhesion layer are formed by a sputtering method is placed on a quartz wafer boat. Then, the quartz wafer boat is introduced into a reactor purged with $N_2$ and heated to 380° C.

After the quartz wafer boat has been introduced, gas in the reaction chamber 1 is exhausted and vacuum leak is checked. Then, oxygen in a quantity of 3 slm and argon in a quantity of 1.5 slm are introduced through the multi-hole injector 3. Moreover, argon in a quantity of 500 sccm is introduced through the gas injector 4. Thus, the pressure in a reaction tube is set to be 200 Pa. In a state in which the pressure of 200 Pa in the reaction tube is maintained, heat recovery is performed for about 30 minutes. Thus, the temperature in the reaction tube is uniformly made to be 400° C. Thus, a thin BST film was formed by the CVD method similarly to the first embodiment.

In a state in which the atmosphere in the reaction tube was maintained at a predetermined partial pressure of oxygen, the temperature of the substrate was raised to 650° C. at a rate of 100° C./minute. Then, the temperature was maintained for 30 minutes so that the temperature of the substrate was stabilized. Then, 100% oxygen was substituted for the atmosphere in the reaction tube. Then, the thin BST film was annealed for crystallization.

When the temperature was raised, the partial pressures of oxygen were set to be 0 Pa (no oxygen), 60 Pa, 120 Pa (same as the partial pressure of oxygen when the film was formed by the CVD method) and 200 Pa (100% oxygen atmosphere). Thus, four types of thin BST films were formed.

As described above, 100% oxygen was substituted for the atmosphere in the reaction tube, and then annealing for crystallization was performed. Then, the temperature of the substrate was lowered to 380° C. at a rate of 50° C./minute in the same atmosphere. Moreover, the pressure in the reaction tube was restored to the atmospheric pressure. Then, the semiconductor substrates each having the thin BST film was taken out of the reaction chamber 1.

The electric characteristic of each sample (a capacitor) having the thin BST film formed by the above-mentioned sequential process and served as a capacitor insulating film were evaluated. The thickness of the thin BST film of the sample was 30 nm. A platinum film having a thickness of 50 nm was employed to form each of the upper capacitor electrode and the lower capacitor electrode. The samples were measured by using the HP4192A measuring apparatus at a measuring frequency of 100 kHz. As a result, the dielectric loss of each of the samples was 0.1% or lower. The samples were the samples each having the structure that the thin BST film served as the capacitor insulating film and formed by setting the partial pressures of oxygen when the temperature was raised were 0 Pa (no oxygen), 60 Pa, 120 Pa (same as the partial pressure of oxygen when the film was formed by the CVD method) and 200 Pa (100% oxygen atmosphere).

Figure 3:
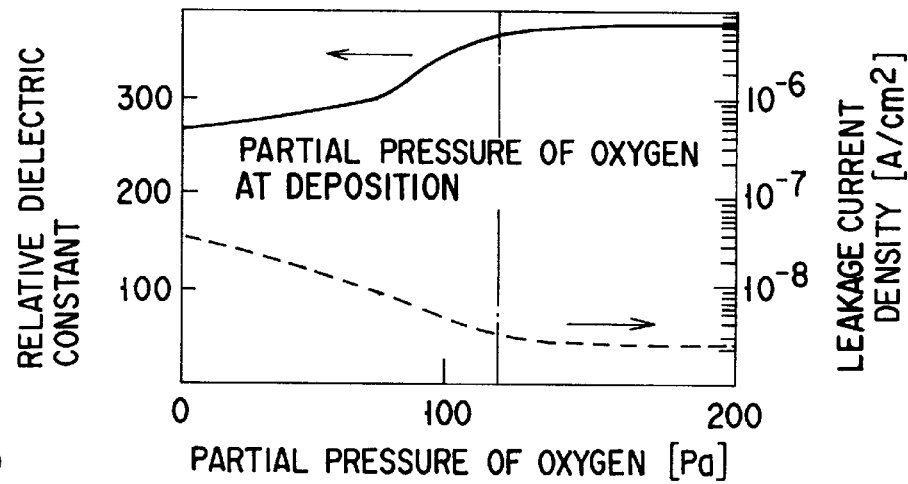
FIG. 3 is a graph showing an influence of the partial pressure of oxygen on the characteristic of the film formed by a method of forming a thin BST film according to a second embodiment of the present invention.

FIG. 3 shows dependency of the dielectric constants of the samples on the partial pressure of oxygen and dependency of leakage currents on the partial pressure of oxygen. As can be understood from FIG. 3, a low leakage current density and a high dielectric constant can be obtained when the temperature is raised in the atmosphere having a partial pressure of oxygen higher than the partial pressure of oxygen when the film is formed.

The profile of oxygen in the direction of the thickness of the film of each sample was measured by Auger electron spectroscopy. As a result, a fact was found that the sample having the low partial pressure of oxygen when the temperature is raised as compared with the partial pressure of oxygen when the film is formed encounters reduction in the concentration of oxygen at the interface (the interface between BST and lower electrode made of platinum) between the thin BST film and the lower capacitor electrode (the platinum film).

That is, the method according to this embodiment has the structure that the process for raising the temperature is performed in a state in which the partial pressure of oxygen in the reaction tube is made to be not lower than the partial pressure of oxygen set when the film is formed. A fact was found that an excellent interface between BST and lower electrode made of platinum can be formed in the foregoing case.

Third Embodiment

In this embodiment, an apparatus for manufacturing a semiconductor similar to that according to the first embodiment was operated so that a thin BST film was formed by the CVD method and sequential annealing of the thin BST film was performed.

Initially, a semiconductor substrate having a surface on which the thin BST film will be formed is prepared. The semiconductor substrate having the surface on which a ruthenium film (a lower capacitor electrode) having a thickness of 50 nm is formed by a sputtering method is placed on a quartz wafer boat (a wafer susceptor). Then, the quartz wafer boat is introduced into a reactor purged with $N_2$ by a mechanism (not shown) and heated to 380° C.

After the quartz wafer boat has been introduced, gas in the reaction chamber 1 is exhausted, and then vacuum leak is checked. Then, oxygen in a quantity of 3 slm and argon in a quantity of 1.5 slm are introduced through the multi-hole injector 3. Moreover, argon in a quantity of 500 sccm is introduced through the gas injector 4. Thus, the pressure in a reaction tube is set to be 200 Pa. In a state in which the pressure of 200 Pa in the reaction tube is maintained, heat recovery is performed for about 30 minutes. Thus, the temperature in the reaction tube is uniformly made to be 400° C.

Then, a source gas for BST is introduced into the reaction chamber 1 from the source-gas supply system 2. The liquid source for BST in the source-gas supply system 2 is tetrahydrofuran (THF) solution which contains sources which are $Ba(dpm)_2$, $Sr(dpm)_2$ and $Ti(dpm)_2$ $(i-OC_3H_7)_2$ at a concentration of 0.5 mol/l. Ba, Sr and Ti source supply rates are independently controlled. The sources $Ba(dpm)_2$, $Sr(dpm)_2$ and $Ti(dpm)_2$ $(i-OC_3H_7)_2$ are supplied at rates of 0.3 sccm, 0.2 sccm and 1 sccm, respectively. The liquid sources are vaporized and mixed with one another so as to be supplied to the spaces among the semiconductor substrates through the multi-hole injector 3 having a blowing opening corresponding to each the semiconductor substrate.

Under the above-mentioned deposition conditions, a realized rate for forming the thin BST film was 1 nm/minute.

In a state in which the temperature in the reactor was maintained at 400° C., argon in a quantity of 4.5 slm is introduced into the reactor through the multi-hole injector 3. Moreover, argon in a quantity of 500 sccm is introduced into the reactor through the gas injector 4 so that replacement of the atmosphere in the reaction tube is performed.

Then, annealing is performed such that the temperature of the substrate is raised to 650° C. at a rate of 100° C./minute. Then, the temperature of the substrate was lowered to 380° C. at a rate of 50° C./minute in the same atmosphere. Moreover, the pressure in the reaction tube is restored to the atmospheric pressure. Then, the semiconductor substrate having the thin BST film formed thereon was taken out. At this time, net anneal process time taken from raising of the temperature to lowering of the same was changed so that the thin BST film was crystallized. Then, the upper capacitor electrode is formed.

Figure 4:
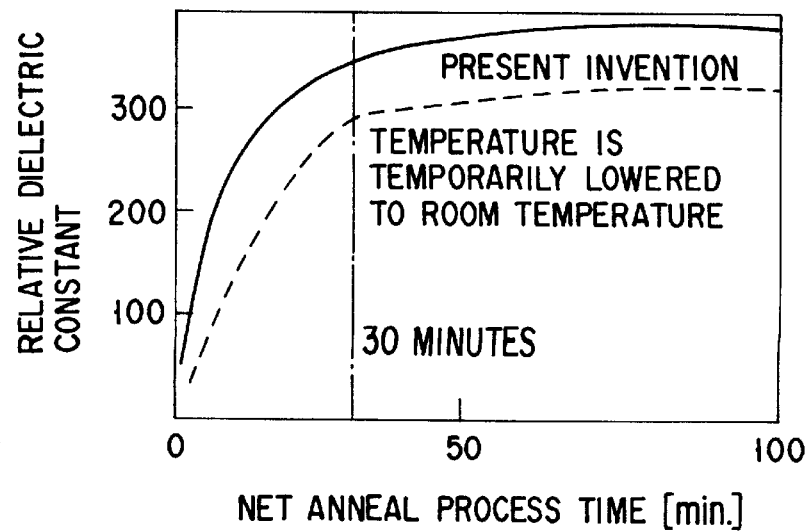
FIG. 4 is a graph showing an influence of actual annealing time after the thin BST film has been formed by the method of forming a thin BST film according to a third embodiment of the present invention.

The relationship between the net anneal process time in the above-mentioned sequential process and the dielectric constant is shown in FIG. 4. Data items indicated with a dashed line in the drawing denote values obtained when the semiconductor substrate is taken out of the reaction chamber 1 to the atmosphere after which the temperature was lowered to the room temperature.

As can be understood from FIG. 4, the method according to the present invention is a preferred method to effectively prevent reduction in the relative dielectric constant. The present invention has the structure that the temperature of the semiconductor substrate is not lowered to the room temperature, that is, the normal temperature after the thin BST film has been formed by the CVD method. Then, the shift to high-temperature anneal process is performed. Moreover, annealing is performed for 30 minutes or longer.

Fourth Embodiment

In this embodiment, an apparatus for manufacturing a semiconductor similar to that according to the first embodiment was operated so that a thin BST film was formed by the CVD method and subsequent annealing of the thin BST film was performed.

That is, a semiconductor substrate having a surface on which the thin BST film will be formed is prepared. The semiconductor substrate having the surface on which a ruthenium film (a lower capacitor electrode) having a thickness of 50 nm is formed by a sputtering method is placed on a quartz wafer boat. Then, the quartz wafer boat is introduced into a reactor purged with $N_2$ and heated to 380° C.

After the quartz wafer boat has been introduced, gas in the reaction chamber 1 is exhausted, and then vacuum leak is checked. Then, oxygen in a quantity of 3 slm and argon in a quantity of 1.5 slm are introduced through the multi-hole injector 3. Moreover, argon in a quantity of 500 sccm is introduced through the gas injector 4. Thus, the pressure in a reaction tube of the reaction chamber 1 is set to be 200 Pa. In a state in which the pressure of 200 Pa in the reaction tube of the reaction chamber 1 is maintained, heat recovery is performed for about 30 minutes. Thus, the temperature in the reaction tube is uniformly made to be 400° C.

Then, a first thin BST film having a thickness of 5 nm was formed by the CVD method under similar conditions to those according to the third embodiment.

In a state in which the temperature of the reactor was maintained at 400° C., argon in a quantity of 4.5 slm is introduced into the reactor through the multi-hole injector 3 and argon in a quantity of 500 sccm is introduced into the same through the gas injector 4. Thus, replacement of the atmosphere in the reaction tube is performed.

Then, annealing is performed such that the temperature of the substrate is raised to 650° C. at a rate of 100° C./minute and time taken from raising oxygen the temperature to lowering of the temperature is set to be 30 minutes. Thus, the thin BST film is crystallized.

Then, the temperature of the substrate is lowered to 400° C. at a rate of 50° C./minute in the same atmosphere. Then, oxygen in a quantity of 3 slm and argon in a quantity of 1.5 slm are introduced through the multi-hole injector 3. Moreover, argon in a quantity of 500 sccm is introduced through the gas injector 4. Thus, the pressure in the reaction tube is maintained at 200 Pa so that a second thin BST film having a thickness of 5 nm is formed under similar conditions according to the third embodiment.

In a state in which the temperature in the reactor is maintained at 400° C., argon in a quantity of 4.5 slm is introduced into the furnace through the multi-hole injector 3. Moreover, argon in a quantity of 500 sccm is introduced into the same through the gas injector 4. Thus, replacement of the atmosphere in the reaction tube is performed.

Then, the second thin BST film was crystallized such that the temperature of the substrate was raised to 650° C. at a rate of 100° C./minute and time taken from raising of the temperature to lowering of the temperature was set to be 30 minutes.

Then, the foregoing process for forming the thin BST film by the CVD method and crystallizing the thin BST film was repeated four times. Thus, a thin BST film having a total thickness of 30 nm was formed.

Then, the temperature of the substrate was lowered to 380° C. at a rate of 50° C./minute. Then, the pressure in the reaction tube was changed to the atmospheric pressure, followed by taking out the semiconductor substrate having the thin BST film formed thereon. Then, the upper capacitor electrode is formed.

Figure 5:
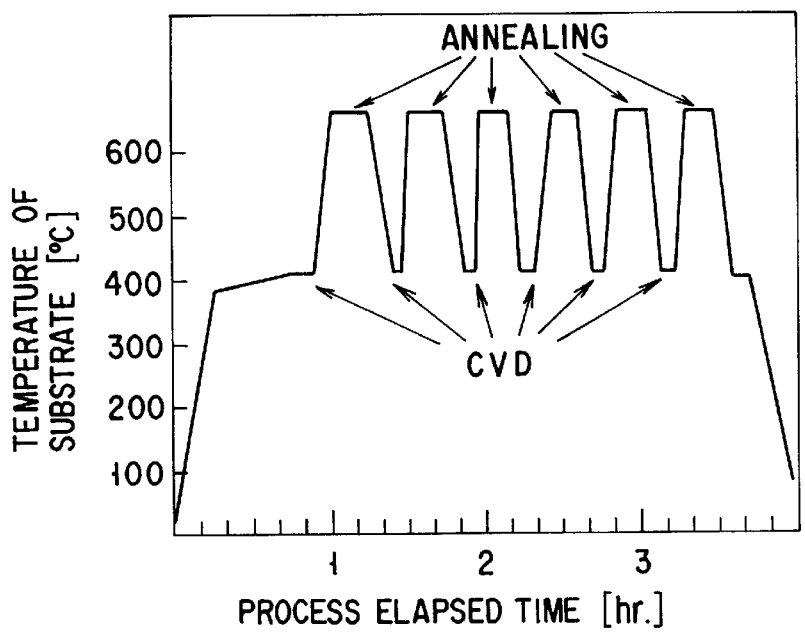
FIG. 5 is a graph showing the relationship between elapsed time of the process of a method of forming a thin BST film according to a fourth embodiment of the present invention and the temperature of a semiconductor substrate.

The relationship between elapsed time of the above-mentioned sequential process and the temperatures of the substrate is shown in FIG. 5.

Moreover, the following samples were manufactured: a sample obtained by, ten times, repeating a process for forming the thin BST film having a thickness of 3 nm and a sequential process for crystallizing the thin BST film; a sample obtained by, six times, repeating a process for forming the thin BST film having a thickness of 5 nm and a sequential process for crystallizing the thin BST film; a sample obtained by, three times, repeating a process for forming the thin BST film having a thickness of 10 nm and a sequential process for crystallizing the thin BST film; and a sample obtained by, two times, repeating a process for forming the thin BST film having a thickness of 15 nm and a sequential process for crystallizing the thin BST film.

Table 2 shows the dielectric constant and a leakage current density of the thus-obtained thin BST film at an applied voltage bias of 1V; and the dielectric constant and a leakage current density of a thin BST film having a thickness of 30 nm and formed by performing the first step for forming the thin BST film by the CVD method and by performing sequential crystallization of the thin BST film, the leakage current density being a density at an applied voltage bias of 1V.

TABLE 2

|  | 30 nm × 1 | 15 nm × 2 | 10 nm × 3 | 5 nm × 6 | 3 nm × 10 |
|---|---|---|---|---|---|
| Relative dielectric constant ($\epsilon 0$) | 360 | 358 | 367 | 352 | 370 |
| Leakage current density when 1V was applied | $3 \times 10^{-8}$ | $3 \times 10^{-8}$ | $1 \times 10^{-8}$ | $7 \times 10^{-9}$ | $6 \times 10^{-9}$ |

The samples were manufactured and evaluated under the same conditions as those according to the first embodiment. In order to accurately measure the leakage current density, the measurement was performed 1000 seconds after the bias voltage was applied so that an influence of a relaxation current completely decreased.

As can be understood from Table 2, the dielectric constant does not considerably vary among the samples. However, the leakage current is reduced in proportion to the unit thickness. The reason for this will now be considered. The thin BST film formed by the CVD method shrinks during the crystallization process. Therefore, microcracks are easily formed in the film by a degree in inverse proportion to the thickness of the film. Moreover, the quantity of residual carbon in the film can be reduced in proportion to the thickness of the film.

Fifth Embodiment

In this embodiment, an apparatus for manufacturing a semiconductor similar to that according to the first embodiment was operated so that a thin BST film was formed by the CVD method, followed by sequentially performing annealing of the thin BST film.

Initially, a semiconductor substrate having a surface on which the thin BST film will be formed is prepared. The semiconductor substrate having the surface on which a ruthenium film (a lower capacitor electrode) having a thickness of 50 nm is formed by a sputtering method is placed on a quartz wafer boat. Then, the quartz wafer boat is introduced into a reactor purged with $N_2$ and heated to 360° C.

After the quartz wafer boat has been introduced, gas in the reaction chamber 1 is exhausted. Then, vacuum leak is checked. Then, oxygen in a quantity of 3 slm and argon in a quantity of 1.5 slm are introduced through the multi-hole injector 3. Moreover, argon in a quantity of 500 sccm is introduced through the gas injector 4. Thus, the pressure in a reaction tube is set to be 200 Pa. In a state in which the pressure of 200 Pa in the reaction tube is maintained, heat recovery is performed for about 30 minutes. Thus, the temperature in the reaction tube is uniformly made to be 360° C.

Under the following conditions, a thin BST film having a thickness of 2.5 nm is formed:

Then, as a liquid source, tetrahydrofuran (THF) solution was supplied which contained sources which were $Ba(dpm)_2$, $Sr(dpm)_2$ and $Ti(dpm)_2$ $(i-OC_3H_7)_2$ at a concentration of 0.5 mol/l. Ba, Sr and Ti source supply rates are independently controlled. The sources $Ba(dpm)_2$, $Sr(dpm)_2$ and $Ti(dpm)_2$ $(i-OC_3H_7)_2$ are controlled so as to supplied at rates of 0.3 sccm, 0.2 sccm and 1.5 sccm, respectively. The liquid sources are vaporized and mixed with one another so as to be supplied to the spaces among the semiconductor substrates through the multi-hole injector 3 having blowing openings corresponding to the semiconductor substrates. At this time, the deposition rate of the thin BST film was 0.2 nm/minute.

In a state in which the temperature in the reactor was maintained at 360° C., argon in a quantity of 4.5 slm is introduced into the reactor through the multi-hole injector 3. Moreover, argon in a quantity of 500 sccm is introduced into the reactor through the gas injector 4 so that replacement of the atmosphere in the reaction tube is performed.

Then, annealing is performed such that the temperature of the substrate is raised to 650° C. at a rate of 100° C./minute and time taken from raising of the temperature to lowering of the temperature is 30 minutes. The thin BST film having a thickness of 5 nm is crystallized.

Then, the temperature of the substrate was lowered to 400° C. at a rate of 50° C./minute in the same atmosphere. Then, oxygen in a quantity of 3 slm and argon in a quantity of 1.5 slm are introduced through the multi-hole injector 3. Moreover, argon in a quantity of 500 sccm is introduced through the gas injector 4. Thus, the pressure in the reaction tube is set to be 200 Pa. In a state in which the pressure in the reaction tube is maintained at 200 Pa, tetrahydrofuran (THF) solution was, as the condition under which the source for the BST was supplied, supplied which contained sources which were $Ba(dpm)_2$, $Sr(dpm)_2$ and $Ti(dpm)_2$ $(i-OC_3H_7)_2$ at a concentration of 0.5 mol/l. Thus, a second thin BST film having a thickness f 25 nm was formed. The sources $Ba(dpm)_2$, $Sr(dpm)_2$ and $Ti(dpm)_2$ $(i-OC_3H_7)_2$ were controlled so as to supplied at rates of 0.3 sccm, 0.2 sccm and 0.9 sccm, respectively. At this time, the deposition rate of the second thin BST film was 5 nm/minute.

In a state in which the temperature of the furnace was maintained at 400° C., argon in a quantity of 4.5 slm is introduced into the furnace through the multi-hole injector 3. Moreover, argon in a quantity of 500 sccm is introduced into the furnace through the gas injector 3. Thus, replacement of the atmosphere in the reaction tube is performed. Then, annealing is performed such that the temperature of the substrate is raised to 650° C. at a rate of 100° C./minute. Moreover, time taken from raising of the temperature to lowering of the temperature is made to be 30 minutes. Thus, the second thin BST film is crystallized.

Then, the temperature of the substrate was lowered to 360° C. at a rate of 50° C./minute. Then, the pressure in the reaction tube was restored to the atmospheric pressure, and then the substrate having the thin BST film formed thereon was taken out. Then, an upper capacitor electrode is formed.

Table 3 shows the following results: an average of surface roughness of the thin BST film (hereinafter abbreviated to deposition at 360° C.+deposition at 400° C.) obtained by the above-mentioned procedure; an average of surface roughness of a sample (hereinafter abbreviated to deposition at 400° C.) formed by the method according to the fourth embodiment. Moreover, Table 3 shows an average of surface roughness of a sample (hereinafter abbreviated to deposition at 360° C.) having the thin BST film having a thickness of 30 nm and formed by one deposition step performed at 360° C.; and leakage current densities at an applied voltage bias of 2V to each sample.

TABLE 3

|  | 360° C. | 360° C. + 400° C. | 400° C. |
| --- | --- | --- | --- |
| Average surface roughness (Ra) (nm) | 0.4 | 0.2 | 1.8 |
| Leakage current density (A/cm$^2$) | $4.5 \times 10^{-7}$ | $3.2 \times 10^{-7}$ | $5.8 \times 10^{-5}$ |

Samples for use in evaluating the electrical characteristics are manufactured by a procedure which is the same as that according to the first embodiment. The samples resulted in any considerable difference being not observed in the relative dielectric constant. The roughness of the surface was evaluated by an atomic force microscope.

As can be understood from Table 3, the surface roughness varies by an order between deposition at 360° C.+deposition at 400° C. and deposition at 400° C. As a result, the leakage current of deposition at 360° C.+deposition at 400° C. is reduced by about one order. The reason for this lies in that generation of nuclei for growing the thin BST film was performed sufficiently on the ruthenium film (the lower capacitor electrode) at a low temperature of 360° C.

The roughness of the surface of the sample formed by deposition at 360° C. is greater than that of the sample formed by deposition at 360° C.+deposition at 400° C. A state of the ruthenium film of the sample formed by deposition at 360° C. was examined by removing the thin BST film with ammonium fluoride solution. As a result, a fact was recognized that surface roughness of the ruthenium film increases.

That is, a deposition process at a low temperature is effective to prevent roughness of BST. However, Ru has a characteristic that roughness is enlarged when annealing is performed at a low temperature for long time. Thus, a fact can be understood that the method according to this embodiment, in which only generation of nuclear for growing BST at the interface between the thin BST film and the ruthenium film is performed at a low temperature, is advantageous to control roughness of BST.

Sixth Embodiment

In this embodiment, an apparatus for manufacturing a semiconductor similar to that according to the first embodiment is operated so that a thin BST film is formed by the CVD method, followed by performing sequential annealing of the thin BST film.

Initially, a semiconductor substrate having a surface on which the thin BST film will be formed is prepared. The semiconductor substrate having the surface on which a ruthenium film (a lower capacitor electrode) having a thickness of 50 nm is formed by a sputtering method is placed on a quartz wafer boat. Then, the quartz wafer boat is introduced into a reactor purged with $N_2$ by a mechanism (not shown) and heated to 360° C.

After the quartz wafer boat has been introduced, gas in the reaction chamber 1 is exhausted, and then vacuum leak is checked. Then, oxygen in a quantity of 3 slm and argon in a quantity of 1.5 slm are introduced through the multi-hole injector 3. Moreover, argon in a quantity of 500 sccm is introduced through the gas injector 4. Thus, the pressure in a reaction tube is set to be 200 Pa. In a state in which the pressure of 200 Pa in the reaction tube is maintained, heat recovery time is about 30 minutes. Thus, the temperature in the reaction chamber is uniformly made to be 400° C.

A first thin BST film having a thickness of 2.5 nm is formed under the following conditions.

That is, as a liquid source, tetrahydrofuran (THF) solution which contains sources which are Ba(dpm)$_2$, Sr(dpm)$_2$ and Ti(dpm)$_2$ (i-OC$_3$H$_7$)$_2$ at a concentration of 0.5 mol/l (a first procedure). Ba, Sr and Ti source supply rates are independently controlled. The sources Ba(dpm)$_2$, Sr(dpm)$_2$ and Ti(dpm)$_2$ (i-OC$_3$H$_7$)$_2$ are controlled so as to be supplied at rates of 0.3 sccm, 0.2 sccm and 1 sccm, respectively.

The liquid sources are vaporized and mixed with one another so as to be supplied to the spaces between the semiconductor substrates through the multi-hole injector 3 having blowing openings corresponding to the semiconductor substrates. The deposition rate of the thin BST film was 2 nm/minute.

In a state in which the temperature in the reactor was maintained at 360° C., argon in a quantity of 4.5 slm is introduced into the reactor through the multi-hole injector 3. Moreover, argon in a quantity of 500 sccm is introduced into the reactor through the gas injector 4 so that replacement of the atmosphere in the reaction tube is performed.

Then, the first thin BST film having a thickness of 2.5 nm is crystallized such that the temperature of the substrate is raised to 650° C. at a rate of 100° C./minutes and time taken from raising of the temperature to lowering of the temperature is made to be 30 minutes.

Then, the temperature of the substrate is lowered to 400° C. at a rate of 50° C./minute in the same atmosphere. Then, oxygen in a quantity of 3 slm and argon in a quantity of 1.5 slm are introduced through the multi-hole injector 3. Moreover, argon in a quantity of 500 sccm is introduced through the gas injector 4. Thus, the pressure in the reaction tube is maintained at 200 Pa. Then, as the condition under which the source for the BST is supplied, tetrahydrofuran (THF) solution is supplied which contains sources which are Ba(dpm)$_2$, Sr(dpm)$_2$ and Ti(dpm)$_2$ (i-OC$_3$H$_7$)$_2$ at a concentration of 0.5 mol/l. Thus, a second thin BST film is formed (a second procedure). Ba, Sr and Ti source supply rates are independently controlled. The sources Ba(dpm)$_2$, Sr(dpm)$_2$ and Ti(dpm)$_2$ (i-OC$_3$H$_7$)$_2$ are controlled as to be supplied at rates of 0.3 sccm, 0.2 sccm and 0.67 sccm, respectively.

Two types of second thin BST films having different thicknesses were formed. One of the films is a thin BST film having a thickness of 25 nm and the other film is a thin BST film having a thickness of 27.5 nm.

In a state in which the temperature of the furnace is maintained at 400° C., argon in a quantity of 4.5 slm was introduced into the furnace through the multi-hole injector 3. Moreover, argon in a quantity of 500 sccm was introduced into the furnace through the gas injector 4. Thus, replacement of the atmosphere in the reaction tube is performed.

Then, the second thin BST film was crystallized such that the temperature of the substrate was raised to 650° C. at a rate of 100° C./minute. Moreover, time taken from raising of the temperature to lowering of the temperature was made to be 30 minutes. Then, the temperature of the substrate was lowered to 400° C. at a rate of 50° C./minute in the same atmosphere.

Then, the sample, on which the second thin BST film having a thickness of 25 nm was formed, was subjected to the same process for forming the first thin BST film having the thickness of 2.5 nm. Thus, a third thin BST film having a thickness of 2.5 nm was formed by the CVD method and annealing for crystallization was performed. Thus, a thin BST film having a total thickness of 30 nm was formed.

Then, the temperature of the structure was lowered to 360° C. at a rate of 50° C./minute. Then, the pressure in the reaction tube was restored to the atmospheric pressure, and then the semiconductor substrate having the thin BST film formed thereon was taken out. Then, the upper capacitor electrode is formed.

Table 4 shows dielectric constants of the thin BST films and leakage current densities realized after voltages of 2V and −2V were applied to the samples. The thin BST films were obtained by either of two types of processes. That is, a process (hereinafter called "two step deposition") for forming the first thin BST film and the second thin BST film (having a thickness of 27.5 nm). Another process is a process (hereinafter called "three step deposition") for forming the first thin BST film, the second thin BST film (having a thickness of 25 nm) and the third thin BST film (having a thickness of 2.5 nm).

TABLE 4

|  | Relative dielectric constant (ε0) | Leakage current (+2V) (A/cm²) | Leakage current (−2V) (A/cm²) |
| --- | --- | --- | --- |
| Two step deposition (sequential) | 360 | $1 \times 10^{-7}$ | $4 \times 10^{-7}$ |
| Two step deposition (discontinuous) | 330 | $2 \times 10^{-7}$ | $5 \times 10^{-7}$ |
| Three step deposition (sequential) | 345 | $1 \times 10^{-7}$ | $1 \times 10^{-7}$ |
| Three step deposition (discontinuous) | 300 | $2 \times 10^{-7}$ | $2 \times 10^{-7}$ |
| First procedure (sequential) | 290 | $1 \times 10^{-7}$ | $1 \times 10^{-7}$ |
| First procedure (discontinuous) | 200 | $2 \times 10^{-7}$ | $2 \times 10^{-7}$ |
| Second procedure (sequential) | 387 | $5 \times 10^{-7}$ | $4 \times 10^{-7}$ |
| Second procedure (discontinuous) | 350 | $5 \times 10^{-7}$ | $5 \times 10^{-7}$ |

The process for manufacturing samples for use in evaluating the electric characteristic is the same as that according to the first embodiment. As a comparative example, Table 4 shows data of a sample obtained by forming a thin BST film having a thickness of 30 nm and formed into a single layer or by the deposition conditions of the first procedure or the second procedure after which sequential annealing for crystallization was performed. Moreover, Table 4 shows results of a process in which the sequential annealing according to the present invention in which lowering of the temperature of the substrate was inhibited is not employed and the substrate was cooled after the film was formed by the CVD method (expressed as "discontinuous").

As can be understood from Table 4, the dielectric constant was reduced in an order as the second procedure, two step deposition, three step deposition and the first procedure.

Another fact can be understood that three step deposition resulted in lowest leakage current densities when the voltage of +2V is applied and when the voltage of −2V is applied. The reason for this lies in that a thin BST film was formed which has small oxygen deficiency because the amount of Ti was made to be excessive in only the interface in order to make the concentration of Ti in the interface to be required value after annealing was performed.

In either case, the discontinuous samples have small dielectric constants as compared with the continued samples. Thus, the method according to the present invention is effective to maintain a high dielectric constant so as to reduce the leakage current.

Seventh Embodiment

In this embodiment, a thin BST film is formed by the following method. That is, a thin BST film is formed by the first procedure according to the fifth embodiment. Then, annealing for crystallization is omitted. Thus, a thin BST film is formed by the second method according to the fifth embodiment so that annealing for crystallization is performed.

Specifically, a semiconductor substrate having a surface on which the thin BST film will be formed is prepared. The semiconductor substrate having the surface on which a ruthenium film (a lower capacitor electrode) having a thickness of 50 nm is formed by a sputtering method is placed on a quartz wafer boat. Then, the quartz wafer boat is introduced into a reactor purged with $N_2$ and heated to 360° C.

After the quartz wafer boat has been introduced, gas in the reaction chamber 1 is exhausted. Then, vacuum leak is checked. Then, oxygen in a quantity of 3 slm and argon in a quantity of 1.5 slm are introduced through the multi-hole injector 3. Moreover, argon in a quantity of 500 sccm is introduced through the gas injector 4. Thus, the pressure in a reaction tube is set to be 200 Pa. In a state in which the pressure of 200 Pa in the reaction tube is maintained, heat recovery is performed for about 30 minutes. Thus, the temperature in the reaction tube is uniformly made to be 360° C.

Under the following conditions, a thin BST film having a thickness of 2.5 nm is formed:

Then, as a liquid source, tetrahydrofuran (THF) solution was supplied which contained sources which were Ba(dpm)$_2$, Sr(dpm)$_2$ and Ti(dpm)$_2$ (i-OC$_3$H$_7$)$_2$ at a concentration of 0.5 mol/l. Ba, Sr and Ti source supply rates are independently controlled. The sources Ba(dpm)$_2$, Sr(dpm)$_2$ and Ti(dpm)$_2$ (i-OC$_3$H$_7$)$_2$ are controlled so as to supplied at rates of 0.3 sccm, 0.2 sccm and 1.5 sccm, respectively. The liquid sources are vaporized and mixed with one another so as to be supplied to the spaces among the semiconductor substrates through the multi-hole injector 3 having blowing openings corresponding to the semiconductor substrates. At this time, the deposition rate of the thin BST film was 0.2 nm/minute.

In a state in which the temperature in the reactor was maintained at 360° C., argon in a quantity of 4.5 slm is introduced into the reactor through the multi-hole injector 3. Moreover, argon in a quantity of 500 sccm is introduced into the reactor through the gas injector 4 so that replacement of the atmosphere in the reaction tube is performed.

Then, the temperature of the substrate was lowered to 400° C. at a rate of 50° C./minute in the same atmosphere. Then, oxygen in a quantity of 3 slm and argon in a quantity of 1.5 slm are introduced through the multi-hole injector 3. Moreover, argon in a quantity of 500 sccm is introduced through the gas injector 4. Thus, the pressure in the reaction tube is set to be 200 Pa. In a state in which the pressure in the reaction tube is maintained at 200 Pa, tetrahydrofuran (THF) solution was, as the condition under which the source for the BST was supplied, supplied which contained sources which were Ba(dpm)$_2$, Sr(dpm)$_2$ and Ti(dpm)$_2$ (i-OC$_3$H$_7$)$_2$ at a concentration of 0.5 mol/l. Thus, a second thin BST film having a thickness f 25 nm was formed. The sources Ba(dpm)$_2$, Sr(dpm)$_2$ and Ti(dpm)$_2$ (i-OC$_3$H$_7$)$_2$ were controlled so as to supplied at rates of 0.3 sccm, 0.2 sccm and 0.9 sccm, respectively. At this time, the deposition rate of the second thin BST film was 5 nm/minute.

In a state in which the temperature of the furnace was maintained at 400° C., argon in a quantity of 4.5 slm is introduced into the furnace through the multi-hole injector 3. Moreover, argon in a quantity of 500 sccm is introduced into the furnace through the gas injector 3. Thus, replacement of the atmosphere in the reaction tube is performed. Then, annealing is performed such that the temperature of the substrate is raised to 650° C. at a rate of 100° C./minute. Moreover, time taken from raising of the temperature to lowering of the temperature is made to be 30 minutes. Thus, the second thin BST film is crystallized.

Then, the temperature of the substrate was lowered to 360° C. at a rate of 50° C./minute. Then, the pressure in the reaction tube was restored to the atmospheric pressure, and then the substrate having the thin BST film formed thereon was taken out. Then, an upper capacitor electrode is formed.

The above-mentioned method of forming a film is able to form a thin BST film having the interface free from excessive oxygen deficiency. As a result, the reliability of the thin BST film can be improved.

Eighth Embodiment

Figure 6:
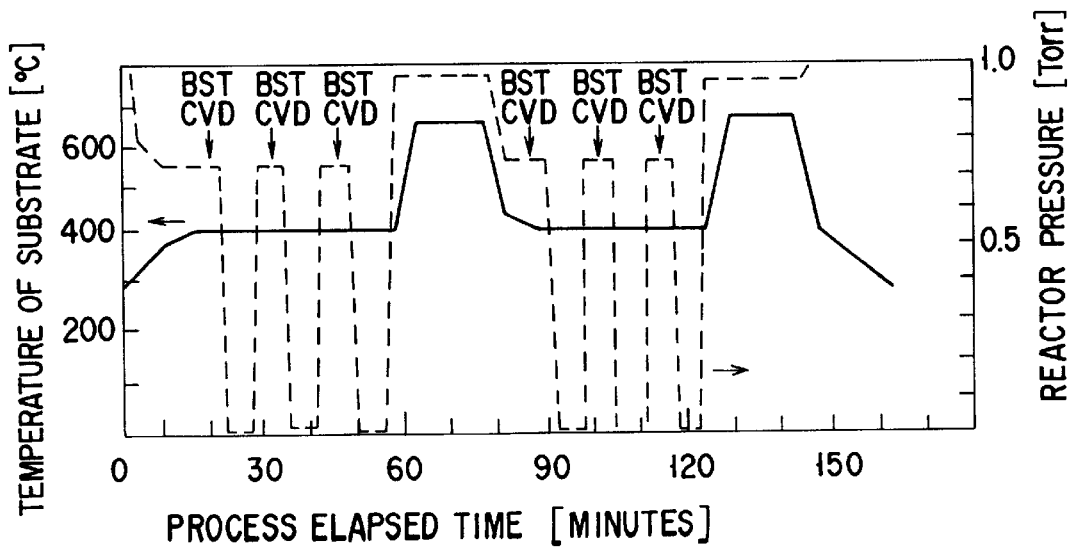
FIG. 6 is a graph showing the relationship between elapsed time of a process of a method of forming a thin BST film according to an eighth embodiment of the present invention and temperature of a semiconductor substrate and a reaction tube pressure.
Figure 7:
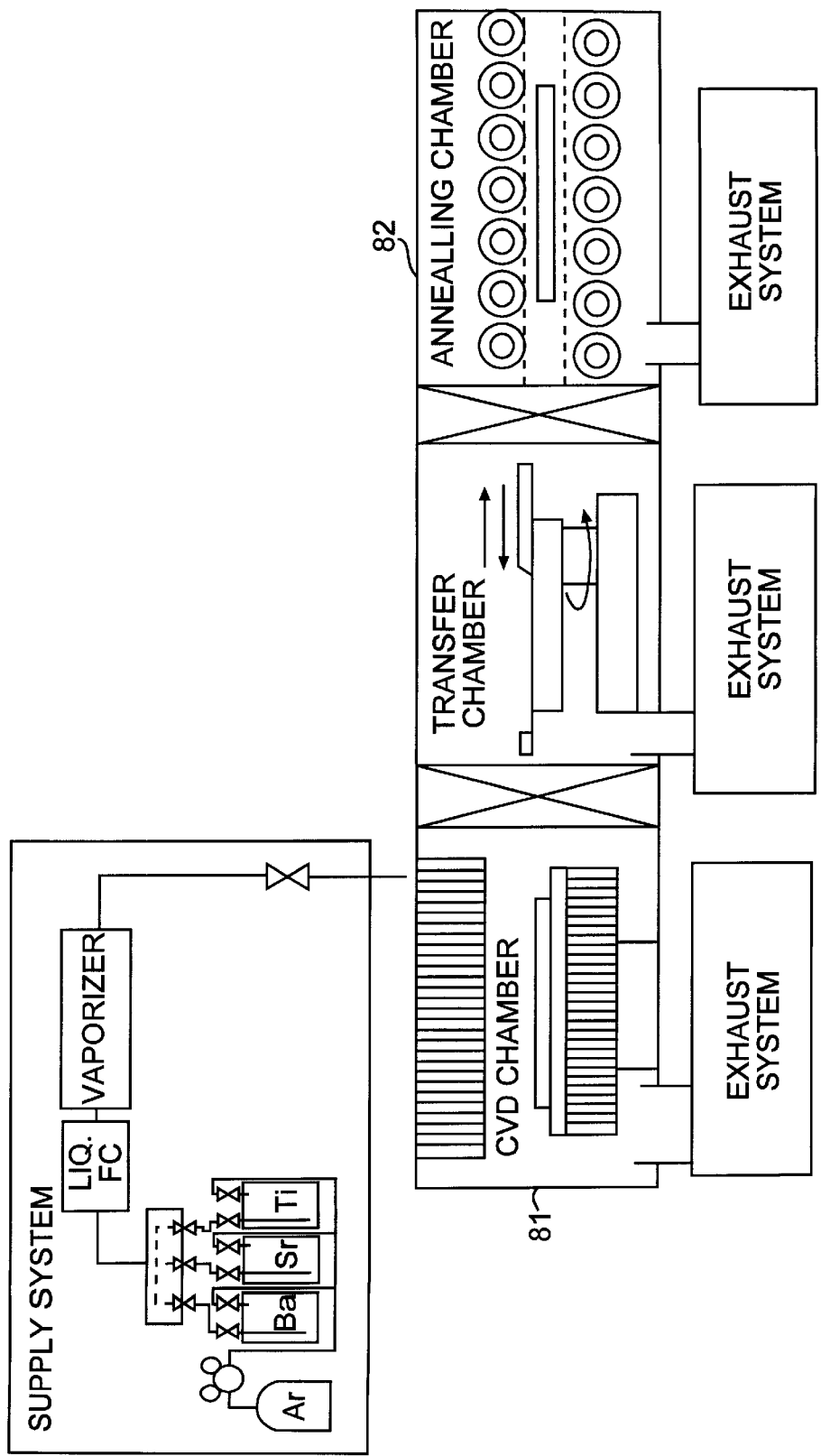
FIG. 7 is a schematic view showing a conventional apparatus for manufacturing a semiconductor device which is capable of sequentially performing a step for forming a film by a CVD method and a annealing step.
Figure 8:
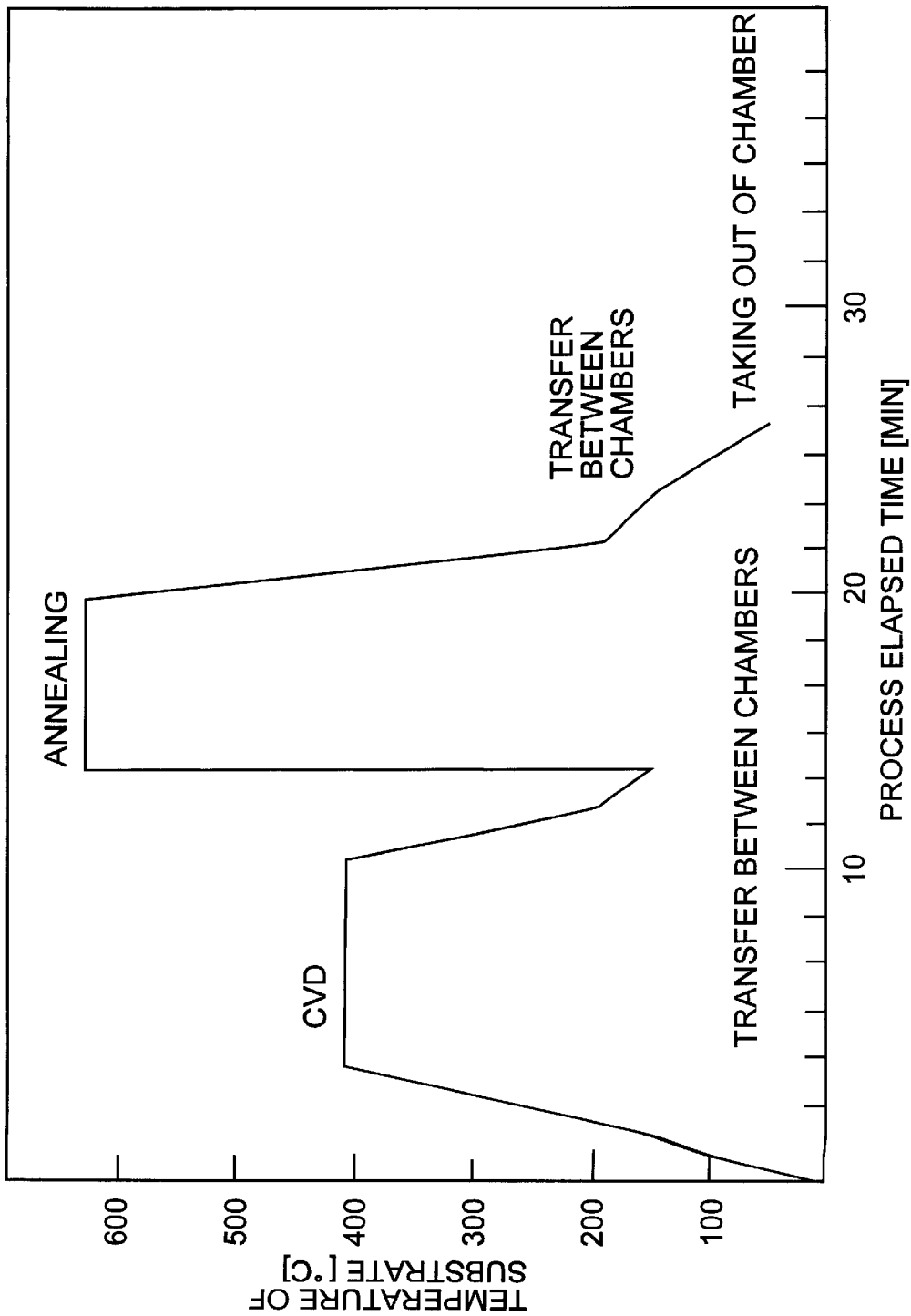
FIG. 8 is a graph showing the relationship between elapsed time of a process of a conventional method of forming a thin BST film and the temperature of a substrate.
Figure 9:
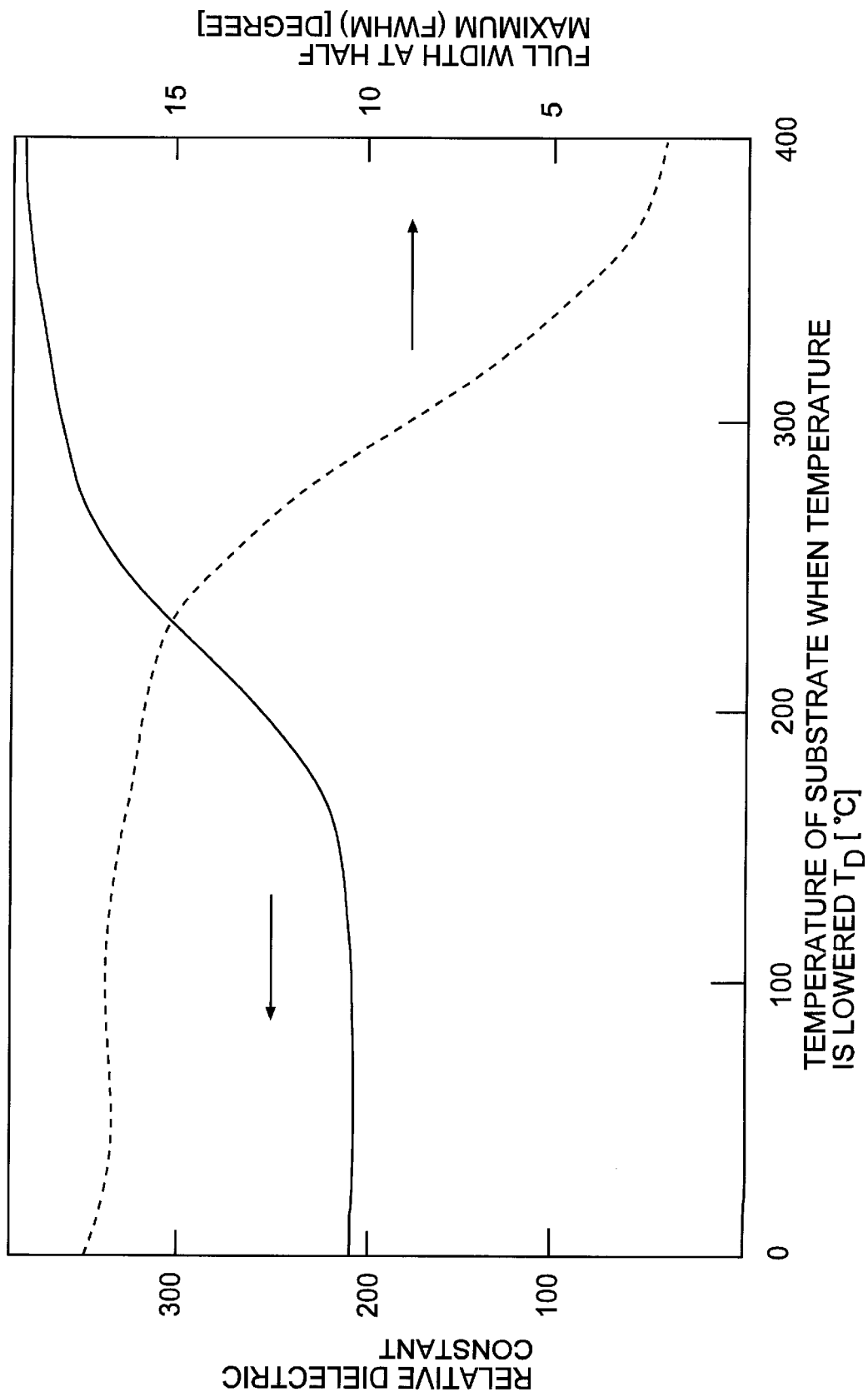
FIG. 9 is a graph showing an influence of the temperature of the substrate lowered after a thin BST film has been formed on the characteristic of the film.
Figure 10:
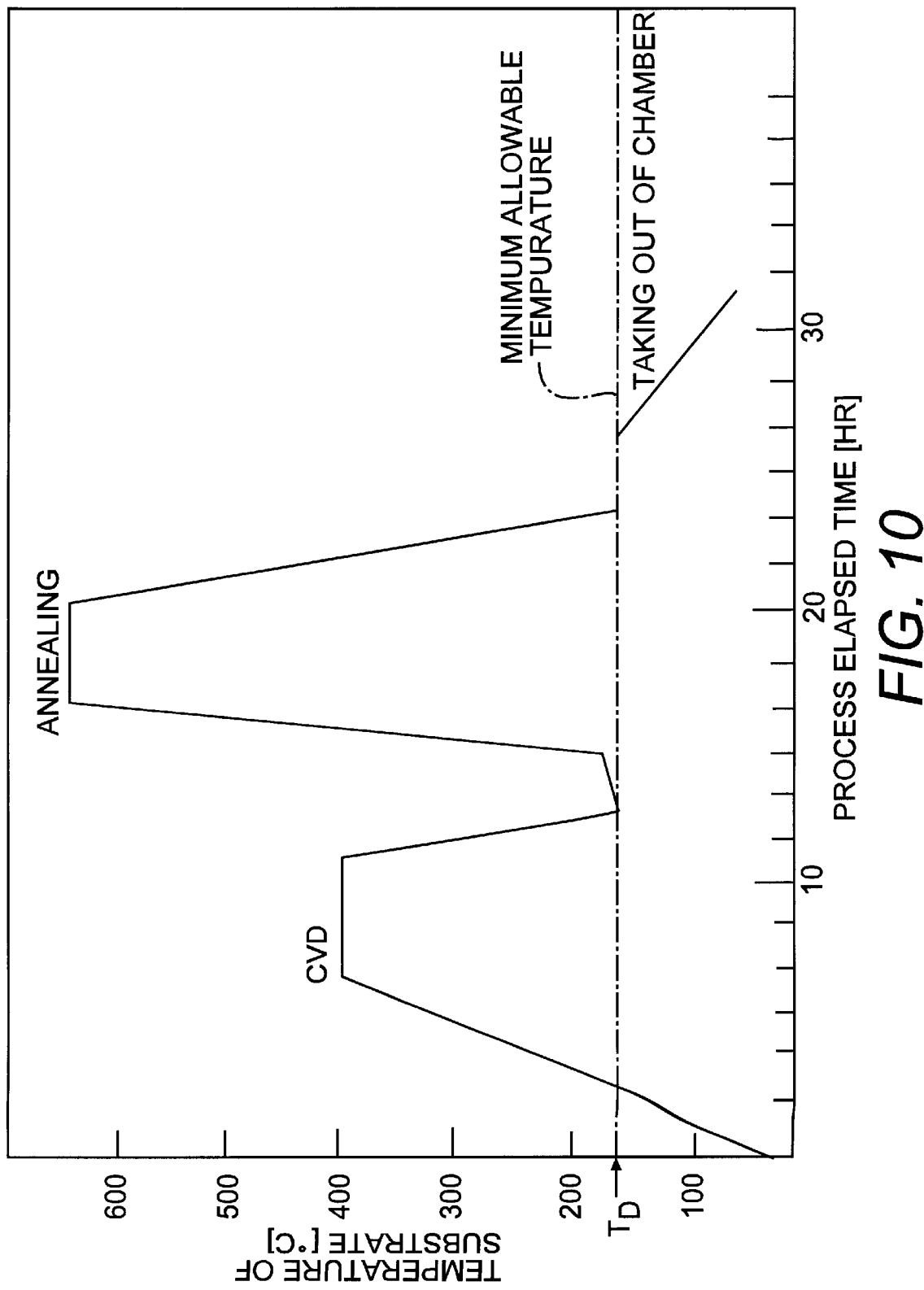
FIG. 10 is a graph showing the relationship between elapsed time of the process of a method of forming a thin BST film and the temperature of the substrate.

In this embodiment, an apparatus for manufacturing a semiconductor similar to that according to the first embodiment is operated so that a thin BST film is formed by the CVD method, followed by subsequently performing annealing of the thin BST film. FIG. 6 shows the relationship realized in the sequential process according to this embodiment among processing time, temperatures of the substrate and pressures in the reaction chamber.

Initially, a semiconductor substrate having a surface on which the thin BST film will be formed is prepared. The semiconductor substrate having the surface on which a ruthenium film (a lower electrode) having a thickness of 50 nm has been formed by a sputtering method is placed on a wafer boat (a susceptor). Then, the wafer boat is introduced into a reactor purged with N2 and heated to 300° C.

After the wafer boat has been introduced, gas in the reaction chamber is exhausted by the gas exhaust system 5. Then, vacuum leak is checked. Then, oxygen in a quantity of 3 slm and argon in a quantity of 1.5 slm are introduced through the multi-tube injector 3. Moreover, argon in a quantity of 500 sccm is introduced through the gas injector 4. Thus, the pressure in the reaction chamber 1 is set to be 200 Pa. In a state in which the pressure of 200 Pa in the reaction chamber of the reaction chamber 1 is maintained, heat recovery is performed for about 30 minutes. Thus, the temperature in the reaction chamber is uniformly made to be 400° C.

Under conditions similar to those according to the third embodiment, a thin BST film having a thickness of 3 nm was formed. That is, source gas for BST is introduced from the gas supply system 2 into the reaction chamber 1. In this embodiment, the liquid source for BST in the gas supply system 2 is tetrahydrofuran (THF: C$_4$H$_8$O) solution which contains Ba(dpm)$_2$, Sr(dpm)$_2$ and Ti(dpm)$_2$ (t-OC$_4$H$_9$)$_2$ at a concentration of 0.5 mol/l. Ba, Sr and Ti source supply rates are independently controlled. The sources Ba(dpm)$_2$, Sr(dpm)$_2$ and Ti(dpm)$_2$ (t-OC$_4$H$_9$)$_2$ are controlled so as to be supplied at rates of 0.3 sccm, 0.2 sccm and 0.6 sccm, respectively.

The liquid sources are vaporized and mixed with one another so as to be supplied between wafers through the multi-hole injector 3 having blowing openings corresponding to the semiconductor substrates. Supply rates of the sources are controlled by a liquid flow controller (liq. FC) of the gas supply system 2. The sources are vaporized by a vaporizer of the sources supply system 2.

Under the above-mentioned film deposition conditions, the film deposition rate of the thin BST film was 1 nm/minute.

In a state in which the temperature in the reactor is maintained at 400° C., argon in a quantity of 3 slm is introduced into the reactor through the multi-level injector 3. Moreover, argon in a quantity of 500 sccm is introduced into the reactor through the gas injector 4 so that replacement of the atmosphere in the reaction chamber is performed.

Then, the temperature of the reactor was maintained at 400° C. In this state, the gas in the reactor was temporarily exhausted so that a vacuum state was realized. A realized degree of vacuum of 10 mTorr or lower was maintained for 5 minutes. Then, the gas was again introduced. Under conditions similar to those according to the third embodiment, a BST film having a thickness of 3 nm was formed.

In a state in which the temperature of the reactor was maintained at 400° C., gas in the reactor was temporarily exhausted so that a vacuum state was realized. A state in which a realized degree of vacuum was 10 mTorr or lower was maintained for 5 minutes.

Similar steps for forming the BST film and exhausting for realizing a vacuum state were repeated one time so that a BST film having a total thickness of 10 nm was formed.

In a state in which the temperature of the reactor is maintained at 400° C., argon in a quantity of 2 slm is introduced into the reactor through the multi-level injector 3. Moreover, argon in a quantity of 500 sccm is introduced through the gas injector 4. Thus, replacement of the atmosphere in the reaction chamber is performed.

Then, annealing was performed such that the temperature of the substrate was raised to 650° C. at a rate of 100° C./minute. Moreover, time taken from raising of the temperature to lowering of the temperature was made to be 30 minutes. Thus, the thin BST film was crystallized. As a result, a BST film having a thickness of 3 nm was formed.

Similar steps for forming the film by the CVD method and exhausting for realizing a vacuum state were repeated three times, and the crystallizing step was performed one time. Thus, a BST film having a total thickness of about 20 nm was formed.

Then, in the same atmosphere, the temperature of the substrate was lowered to 380° C. at a rate of 50° C./minute. Moreover, the pressure in the reaction chamber was restored to the atmospheric pressure, and then the substrate having the thin BST film formed thereon was taken out.

FIG. 6 shows the relationship among the processing time, the temperatures of the substrate and the pressures in the reactor realized in the sequential process.

The concentration of impurities in the BST film was examined by SIMS, resulting in a very low concentration of about 0.01 atomic %. A quadruple mass spectrometer was equipped to the reaction chamber so that the gas component in the process was examined. As a result, desorption of carbon dioxide from the BST film into the exhausted vacuum gas immediately after each of the films was formed was confirmed. As a result of the desorption of carbon dioxide, a considerably low concentration of the carbon impurities in the BST film was realized.

As for the crystalline characteristics including the relative dielectric constant, the relative dielectric constant was 420 and the full width at half maximum was 3.6. Thus, results superior to those realized in the first embodiment were realized. It can be considered that a synergistic effect was obtained which consisted of the effect obtained from the annealing step in which the temperature was not lowered after the film was formed by the CVD method and the effect of reducing carbon impurities by performing the vacuum exhausting step.

The unit thickness of the BST film was varied to 2 nm, 3 nm, 5 nm and 10 nm to measure the concentration of carbon impurities in the BST film. As a result, the concentration of the carbon impurities in the BST film was decreased in inverse proportion to the unit thickness. When the unit thickness was 3 nm, the concentration of the carbon impurities in the BST film reached an allowable level.

The present invention is not limited to the above-mentioned embodiments. Although the above-mentioned embodiments have been described about the process in which annealing for crystallization is performed at 650° C., another temperature may be employed if the thin BST film can be crystallized. Although the second embodiment has been described about annealing for crystallization which is performed in an oxygen atmosphere, another atmosphere, for example, a $N_2$ atmosphere or an Ar atmosphere may be employed. That is, an optimum temperature at which annealing for crystallization is performed and the atmosphere may be employed to be suitable to the type of the base electrode or the like.

As described above, according to the present invention, when a thin BST film is formed by the CVD method and annealing is sequentially performed at a temperature higher than the deposition temperature for the thin BST film, deterioration in the quality of the thin BST film is prevented. That is, the temperature of the substrate is maintained at a temperature higher than a predetermined temperature during a period of time between a step for forming the thin BST film and the annealing step. As a result, an excellent thin BST film can be formed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising:
    a first step for forming, on a semiconductor substrate, a thin insulating film mainly made of barium strontium titanate by a CVD method; and
    a second step for performing annealing at a temperature higher than a temperature at which the thin insulting film is formed so that crystallinity of the thin insulating film is improved, wherein
        the temperature of the semiconductor substrate is maintained at a temperature higher than a minimum allowable temperature in a period of time between said first step and said second step.

2. A method of manufacturing a semiconductor device according to claim 1, wherein the minimum allowable temperature is greater than a temperature at which a stable phase or a different phase is formed in the thin insulating film.

3. A method of manufacturing a semiconductor device according to claim 2, wherein the minimum allowable temperature is 250° C. or greater.

4. A method of manufacturing a semiconductor device according to claim 2, wherein the different phase is a phase except for a perovskite crystalline phase mainly composed of barium strontium titanate.

5. A method of manufacturing a semiconductor device according to claim 1, wherein the minimum allowable temperature is greater than a temperature at which the thin insulating film is vulnerable to peeling.

6. A method of manufacturing a semiconductor device according to claim 5, wherein the minimum allowable temperature is 200° C. or greater.

7. A method of manufacturing a semiconductor device according to claim 1, wherein the minimum allowable temperature is greater than a temperature at which the thin insulating film or an electrode film is vulnerable to peeling if the electrode film is formed below the insulating film.

8. A method of manufacturing a semiconductor device according to claim 1, wherein the minimum allowable temperature is a temperature at which the thin insulating film is formed in the first step.

9. A method of manufacturing a semiconductor device according to claim 1, wherein the annealing temperature is a temperature not lower than a temperature at which the thin insulating film is crystallized.

10. A method of manufacturing a semiconductor device according to claim 1, wherein the first and second steps are sequentially performed using a common substrate susceptor in a single annealing chamber without removing said susceptor from said chamber.

11. A method of manufacturing a semiconductor device according to claim 1, wherein the second step is structured such that time taken from raising of the temperature of the semiconductor substrate to the film deposition temperature for the thin insulating film to lowering of the temperature of the semiconductor substrate subjected to the annealing to the deposition temperature is set to be 30 minutes or longer.

12. A method of manufacturing a semiconductor device comprising:
    a first step for forming, on a semiconductor substrate, a thin insulating film mainly made of barium strontium titanate by a CVD method; and
    a second step for performing annealing at a temperature higher than a temperature at which the thin insulting film is formed so that crystallinity of the thin insulating film is improved, wherein
        a sequential process having said first and second steps is repeated several times so that a thin insulating film mainly made of barium strontium titanate and having a required thickness is formed, and the temperature of the semiconductor substrate is maintained at a temperature higher than a minimum allowable temperature in a period of time between said first step and said second step in the sequential process.

13. A method of manufacturing a semiconductor device according to claim 12, wherein the minimum allowable temperature is greater than a temperature at which a stable phase or a different phase is formed in the thin insulating film.

14. A method of manufacturing a semiconductor device according to claim 13, wherein the minimum allowable temperature is 250° C. or greater.

15. A method of manufacturing a semiconductor device according to claim 13, wherein the different phase is a phase except for a perovskite crystalline phase mainly composed of barium strontium titanate.

16. A method of manufacturing a semiconductor device according to claim 12, wherein the minimum allowable temperature is greater than a temperature at which the thin insulating film is peeled.

17. A method of manufacturing a semiconductor device according to claim 16, wherein the minimum allowable temperature is 200° C. or greater.

18. A method of manufacturing a semiconductor device according to claim 12, wherein the minimum allowable temperature is greater than a temperature at which the thin insulating film or an electrode film is peeled if the electrode film is formed below the insulating film.

19. A method of manufacturing a semiconductor device according to claim 12, wherein the minimum allowable temperature is a temperature at which the thin insulating film is formed in the first step.

20. A method of manufacturing a semiconductor device according to claim 12, wherein the annealing temperature is a temperature not lower than a temperature at which the thin insulating film is crystallized.

21. A method of manufacturing a semiconductor device according to claim 12, wherein the first and second steps are sequentially performed using a common substrate susceptor in a single annealing chamber without removing said susceptor from said chamber.

22. A method of manufacturing a semiconductor device according to claim 12, wherein the second step is structured such that time taken from raising of the temperature of the semiconductor substrate to the deposition temperature for the thin insulating film to lowering of the temperature of the semiconductor substrate subjected to the annealing to the deposition temperature is set to be 30 minutes or longer.

23. A method of manufacturing a semiconductor device, according to claim 12, wherein at least either of the deposition temperature or a gas flow rate in the first step is made to be varied in the sequential steps.

24. A method of manufacturing a semiconductor device according to claim 12, wherein in the sequential process, the deposition temperature for the thin insulating film in the first step included in the sequential process is made to be lower than a deposition temperature for the thin insulating film in the first step in a later step of the sequential process.

25. A method of manufacturing a semiconductor device according to claim 12, wherein at least either of gas flow rate or timing at which gas is supplied in the first step is varied in the two sequential steps which are performed sequentially.

26. A method of manufacturing a semiconductor device comprising:

a first step for forming, on a semiconductor substrate, a thin insulating film mainly made of barium strontium titanate by a CVD method; and a second step for performing annealing so that crystallinity of the thin insulating film is improved, wherein said substrate is maintained at a temperature of at least a minimum allowable temperature between said first step and seconds step and wherein the partial pressure of oxygen in an atmosphere in which the semiconductor substrate exists is made to be a partial pressure not lower than a predetermined partial pressure in a period of time between said first step and said second step.

27. A method of manufacturing a semiconductor apparatus according to claim 1, wherein environmental pressure around the semiconductor substrate is exhausted to realize a vacuum state in a step between the first step and the second step.

28. A method of manufacturing a semiconductor apparatus according to claim 27, wherein a step for setting the pressure environment is repeated plural times between the first step and the second step by repeating plural times a step for exhausting the environmental pressure around the semiconductor substrate to realize a vacuum state and a step for supplying gas again to raise the pressure.

29. A method of manufacturing a semiconductor apparatus according to claim 12, wherein environmental pressure around the semiconductor substrate is exhausted to realize a vacuum state in a step between the first step and the second step included in the sequential process.

30. A method of manufacturing a semiconductor apparatus according to claim 29, wherein a step for setting the pressure environment is repeated plural times in a step between the first step and the second step included in the sequential steps by repeating plural times a step for exhausting the environmental pressure around the semiconductor substrate to realize a vacuum state and a step for exhausting gas again to raise the pressure.

* * * * *

UNITED STATES PATENT AND TRADEMARK OFFICE
CERTIFICATE OF CORRECTION

PATENT NO. : 6,159,868
DATED : December 12, 2000
INVENTOR(S) : Katsuhiko Hieda et al.

It is certified that error appears in the above-identified patent and that said Letters Patent is hereby corrected as shown below:

Column 23,
Line 56, "insulting" should read -- insulating --.

Column 24,
Line 45, "insulting" should read -- insulating --.

Column 26,
Line 12, "seconds step" should read -- second step --.

Signed and Sealed this

Fourth Day of June, 2002

*Attest:*

*Attesting Officer*

JAMES E. ROGAN
*Director of the United States Patent and Trademark Office*